United States Patent
Borowik et al.

(10) Patent No.: US 8,697,548 B2
(45) Date of Patent: Apr. 15, 2014

(54) METHOD FOR MAKING SEMI-CONDUCTOR NANOCRYSTALS ORIENTED ALONG A PREDEFINED DIRECTION

(75) Inventors: Lukasz Borowik, Grenoble (FR); Jean-Charles Barbe, Izeron (FR); Ezra Bussmann, Albuouerque, NM (US); Fabien Cheynis, Marseilles (FR); Frédéric Leroy, Marseilles (FR); Denis Mariolle, Grenoble (FR); Pierre Müller, Marseilles (FR)

(73) Assignees: Commissariat a l'energie atomique et aux energies alternatives, Paris (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 13/464,390

(22) Filed: May 4, 2012

(65) Prior Publication Data

US 2012/0282759 A1   Nov. 8, 2012

(30) Foreign Application Priority Data

May 6, 2011 (FR) ...................................... 11 53926

(51) Int. Cl.
| | |
|---|---|
| *H01L 33/06* | (2010.01) |
| *B82Y 40/00* | (2011.01) |
| *B82Y 30/00* | (2011.01) |

(52) U.S. Cl.
USPC ...... 438/478; 977/932; 977/958; 257/E21.09; 438/378

(58) Field of Classification Search
USPC ....................................................... 438/378
See application file for complete search history.

(56) References Cited

U.S. PATENT DOCUMENTS

| | | | |
|---|---|---|---|
| 3,369,164 A | 2/1968 | Ball | |
| 6,090,666 A | 7/2000 | Ueda et al. | |
| 6,747,243 B1* | 6/2004 | Reinhardt | 219/121.69 |
| 7,544,547 B2* | 6/2009 | Fournel et al. | 438/142 |
| 7,995,871 B2* | 8/2011 | Guerra | 385/1 |
| 2005/0136655 A1 | 6/2005 | Wasshuber et al. | |
| 2006/0019459 A1* | 1/2006 | Vinet et al. | 438/378 |
| 2006/0091105 A1 | 5/2006 | Barbe et al. | |
| 2007/0007596 A1 | 1/2007 | Wasshuber et al. | |
| 2007/0228378 A1* | 10/2007 | Fournel et al. | 257/72 |
| 2010/0062587 A1 | 3/2010 | Wasshuber et al. | |
| 2010/0081259 A1* | 4/2010 | Lai et al. | 438/473 |
| 2010/0256408 A1* | 10/2010 | Veinot et al. | 556/431 |

FOREIGN PATENT DOCUMENTS

| | | |
|---|---|---|
| EP | 1 615 271 A1 | 1/2006 |
| EP | 1 619 277 A2 | 1/2006 |
| FR | 2 872 626 A1 | 1/2006 |

OTHER PUBLICATIONS

U.S. Appl. No. 13/464,363, filed May 4, 2012, Borowik et al.
Preliminary Search Report issued Feb. 9, 2012 in French Patent Application No. FR 1153926 (with English Translation of Categories of Cited Documents).

(Continued)

*Primary Examiner* — Colleen Matthews
*Assistant Examiner* — Regan J Rundio
(74) *Attorney, Agent, or Firm* — Oblon, Spivak, McClelland, Maier & Neustadt, L.L.P.

(57) ABSTRACT

A method for making a semi-conductor nanocrystals, including at least the steps of:
  making a stack of at least one uniaxially stressed semi-conductor thin layer and a dielectric layer,
  annealing the semi-conductor thin layer such that a dewetting of the semi-conductor forms, on the dielectric layer, elongated shaped semi-conductor nanocrystals oriented perpendicularly to the stress axis.

5 Claims, 5 Drawing Sheets

(56) References Cited

OTHER PUBLICATIONS

G. Capellini, et al., "Agglomeration process in thin silicon-, strained silicon-, and silicon germanium-on-insulator substrates", Journal of Applied Physics, vol. 105, No. 9, 2009, pp. 093525-1-093525-8.

David T. Danielson, et al., "Surface-energy-driven dewetting theory of silicon-on-insulator agglomeration", Journal of Applied Physics, vol. 100, No. 8, Oct. 20, 2006, pp. 083507-1-083507-10.

Hiroya Ikeda, et al., "In-situ observation of formation process of self-assembled Si islands on buried $SiO_2$ and their crystallographic structures", Microprocesses and nanotechnology Conference, 2003, pp. 18-19.

E. Dornel, et al., "Surface diffusion dewetting of thin solid films: Numerical method and application to $Si/SiO_2$", Physical Review B 73, 2006, pp. 115427-1-115427-10.

E. Dornel, et al., "Orientation-Dependent Dewetting of Patterned Thin Si Film on $SiO_2$", Mater. Res. Soc. Symp. Proc., vol. 910, 2006, 6 pages.

J. Tersoff, et al., "Shape Transition in Growth of Strained Islands: Spontaneous Formation of Quantum Wires", Physical Review Letters, vol. 70, No. 18, May 3, 1993, 5 pages.

Suklyun Hong, et al., "Effect of hydrogen on the surface-energy anisotropy of diamond and silicon", Physical Review B, vol. 57, No. 11, Mar. 15, 1998, pp. 6262-6265.

R.C. Henderson, "Silicon Cleaning with Hydrogen Peroxide Solutions: A High Energy Electron Diffraction and Auger Electron Spectroscopy Study", J. Electrochem. Soc.: Solid-State Science and Technology, 119, Jun. 6, 1972, pp. 772-775.

\* cited by examiner

METHOD FOR MAKING SEMI-CONDUCTOR NANOCRYSTALS ORIENTED ALONG A PREDEFINED DIRECTION

TECHNICAL FIELD

The invention relates to a method for making semi-conductor nanocrystals obtained by dewetting a thin layer of this semi-conductor provided on a dielectric layer, oriented along a direction selected beforehand and which can be used for making microelectronic and/or nanoelectronic devices, for example memory devices.

The invention also relates to a method for making a porous dielectric layer resorting to semi-conductor nanocrystals oriented along a predefined direction.

STATE OF PRIOR ART

For making semi-conductor nanocrystals, that is semi-conductor aggregates the dimensions of which can be between about a few nanometres and a few hundred nanometres, it is known to make a dewetting of a silicon thin layer provided on a $SiO_2$ layer. Indeed, when the silicon thin layer, corresponding for example to the active layer, or upper layer, of a SOI (silicon on insulator) substrate, is subjected to a high temperature (for example between about 650° C. and 1250° C.) annealing, the silicon of this thin layer gradually retracts on itself forming silicon nanocrystals, or aggregates.

Document "Agglomeration process in thin-silicon-, strained silicon-, and silicon germanium-on-insulator substrates>> by G. Capellini et al., Journal of applied physics, vol. 105, 2009, described that the dewetting can be influenced depending on whether a biaxially stressed or nor stressed semi-conductor layer is used. The higher the biaxial stress to which the semi-conductor is subjected and/or the thinner the semi-conductor layer, the higher the size of the semi-conductor nanocrystals formed by dewetting and the higher the density of nanocrystals. By increasing the biaxial stress value, it is possible to reduce the dimensions of nanocrystals, in the plane of the semi-conductor layer, up to about 145 nm.

A biaxially stressed semi-conductor layer is for example obtained by making an hetero-epitaxy of a monocrystalline material on a crystalline substrate characterised by different crystallographic sizes.

The nanocrystals formed by dewetting a biaxially stressed semi-conductor thin layer have either a substantially square shape (this shape corresponds to the cross-section of nanocrystals in a plane for example parallel to one of the main faces of the semi-conductor layer), or a substantially rectangular shape (or more generally an elongated shape, that is comprising a first dimension perpendicular to a second dimension, the first dimension being higher than the second dimension), as a function of the ratio of the surface energy to the initial elastic energy of the semi-conductor material. The elongated shape semi-conductor nanocrystals are randomly oriented along one of the characteristic crystallographic directions of the substrate.

To be unable to choose the orientation of the elongated shape semi-conductor nanocrystals can raise problems, for example when the nanocrystals are to be part of electronic nanodevices and that these nanocrystals are to be at a controlled distance from other elements such as electrodes of nanodevices.

DESCRIPTION OF THE INVENTION

Thus there is a need to provide a method for making semi-conductor nanocrystals enabling not only the dimensions and density of the semi-conductor nanocrystals, but also the orientation of semi-conductor nanocrystals made by dewetting of the semi-conductor, to be controlled regardless the nature (amorphous or crystalline) of the material underlying the semi-conductor.

To do this, one embodiment provides a method for making semi-conductor nanocrystals, including at least the steps of:
  making a stack of at least one uniaxially stressed semi-conductor thin layer and a dielectric layer,
  annealing the semi-conductor thin layer such that a dewetting of the semi-conductor forms, on the dielectric layer, elongated shaped semi-conductor nanocrystals oriented perpendicularly to the stress axis.

Because the uniaxial stress is exerted on the semi-conductor thin layer, the dewetting of the semi-conductor results in semi-conductor nanocrystals in view of the elastic stress exerted on the semi-conductor during the dewetting. Moreover, by selecting the intensity of the stress, the dimensions and density of the semi-conductor nanocrystals formed can be modulated. As the stress is uniaxial, the majority of the semi-conductor nanocrystals formed by the annealing have an elongated shape oriented perpendicularly to the stress axis.

The term "thin layer" herein stands for and throughout the present document a layer of material having a thickness lower or equal to about 1 µm, or lower or equal to about 100 nm. The thickness of the thin layer used may be selected as a function of the intensity of the desired stress: the more stressed the thin layer, the more reduced the thickness of the thin layer. The thickness of the semi-conductor thin layer will be lower than the critical thickness from which the semi-conductor thin layer plastically relaxes through dislocation emission.

Furthermore, the so-called uniaxial stress corresponds to the case where stress is exerted on the semi-conductor only in a single direction, but also to the case where the stress is mainly exerted on the semi-conductor along a direction with an intensity at least twice higher, and preferably at least 10 times higher, than the intensities of the possible other stresses exerted on the semi-conductor along the other directions.

The dielectric layer may be stressed and be provided between the semi-conductor thin layer and a supporting layer, the stressing of the semi-conductor thin layer being achieved by etching at least partially the dielectric layer according to a pattern such that the stress exerted on the etched dielectric layer be uniaxial. The stress perpendicular to the etching flanks may be relaxed in the prestressed dielectric layer by inducing a stress in the semi-conductor thin layer in this same direction but of an opposite sign to the initial stress of the dielectric layer. If the dielectric layer is tensioned (positive stress), the semi-conductor thin layer may be compressively stressed (negative stress), and vice versa.

The uniaxially stressed semi-conductor thin layer may be provided on several layers of materials comprising at least one prestressed layer, for example several layers of dielectric materials at least one of which is prestressed, and/or one or several layers of semi-conductor materials.

The stack comprising the stressed semi-conductor thin layer may include for example:
  a substrate, or supporting layer, for example composed of silicon,
  a silicon and germanium alloy epitaxially deposited onto the substrate, which is then naturally biaxially stressed due to its difference in lattice cell parameters with respect to the silicon substrate,
  a dielectric layer forming an interface between the silicon and germanium alloy and the semi-conductor thin layer, and which can also be used as an electrical insulator between the semi-conductor thin layer and the silicon and germanium alloy.

The intensity value of the uniaxial stress may be selected as a function of the desired dimensions and density of the semi-conductor nanocrystals.

The annealing of the semi-conductor thin layer may be performed at a temperature between about 650° C. and 1250° C. and preferably between about 700° C. and 100° C., and in a ultra-high vacuum environment, that is at a pressure between about $10^{-7}$ mbar and $10^{-12}$ mbar. The annealing may also be performed under a hydrogenated atmosphere.

The annealing of the semi-conductor thin layer may be implemented in a scanning electron microscope or in a controlled environment annealing chamber (which enables the above indicated temperatures and pressures to be obtained).

The invention also relates to a method for making a porous dielectric layer, comprising at least the implementation of a method for making semi-conductor nanocrystals such as described above, wherein the annealing of the semi-conductor thin layer proceeds until the semi-conductor nanocrystals chemically react with the dielectric layer forming a plurality of pores passing through the dielectric layer.

BRIEF DESCRIPTION OF THE DRAWINGS

The present invention will be better understood upon reading the description of exemplary embodiments given only by way of illustrative purpose and in no way limiting by making reference to the appended drawings wherein.

Identical, similar or equivalent parts of the different figures described herein below have the same reference numerals so as to facilitate switching from one figure to another.

Figure 1:
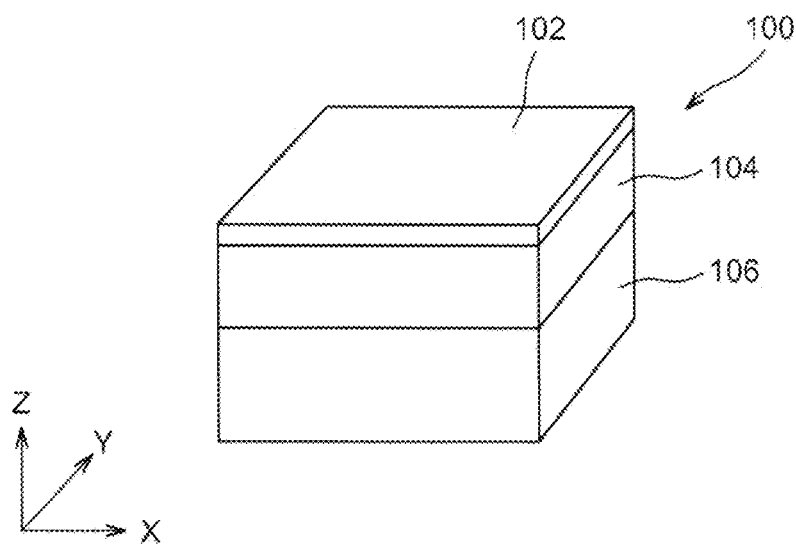
FIGS. 1 to 3B represent the steps of a method for making semi-conductor nanocrystals.

The different parts represented in the figures are not necessarily drawn to a uniform scale, for a better understanding of the figures.

The different possibilities (alternatives and embodiments) should be understood as being not mutually exclusive and can be combined with each other.

DETAILED DESCRIPTION OF PARTICULAR EMBODIMENTS

The steps of a method for making semi-conductor nanocrystals according to a particular embodiment are described in connection with FIGS. 1 to 3B.

The method for making semi-conductor nanocrystals is implemented from a SOI substrate 100 (represented in FIG. 1) comprising a thin layer, that is a thickness lower or equal to about 1 μm, of monocrystalline silicon 102, having a crystallographic orientation (001), covering a $SiO_2$ based buried dielectric layer 104 which rests on a monocrystalline silicon thick layer 106 forming the supporting layer of the substrate 100. The silicon thin layer 102 has a thickness for example equal to about 11 nm.

Generally, the dielectric layer 104 onto which the semi-conductor thin layer 102 is provided can correspond to a layer or a stack of several layers, composed of $SiO_2$ and/or $Si_3N_4$ and/or $Si_xN_y$ (non-stoichiometric silicon nitride) and/or $Si_xO_yN_z$ and/or any other dielectric material, whether crystalline or amorphous.

The dielectric layer 104 can be prestressed. In this case, the dielectric material preferably comprises silicon nitride or silicon oxynitride. The stress depends on the deposition mode used to form the dielectric material, and can be a compressive or tensile stress. In the case of a dielectric layer 104 comprising a crystalline prestressed material, the prestress can be induced by the difference in lattice cell parameter between the crystalline material and the material of the supporting layer 106. This prestress can also be induced by the difference in expansion coefficient between the supporting layer 106 and one of the materials deposited at a temperature different from the annealing temperature during the subsequent dewetting step.

Figure 2A:
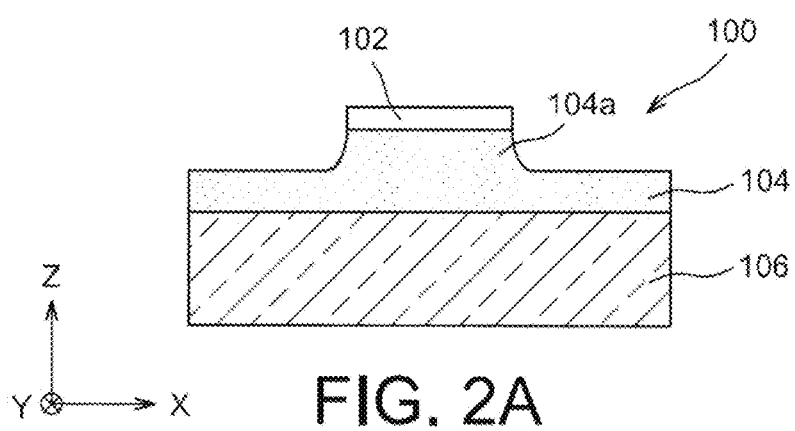
Figure 2B:
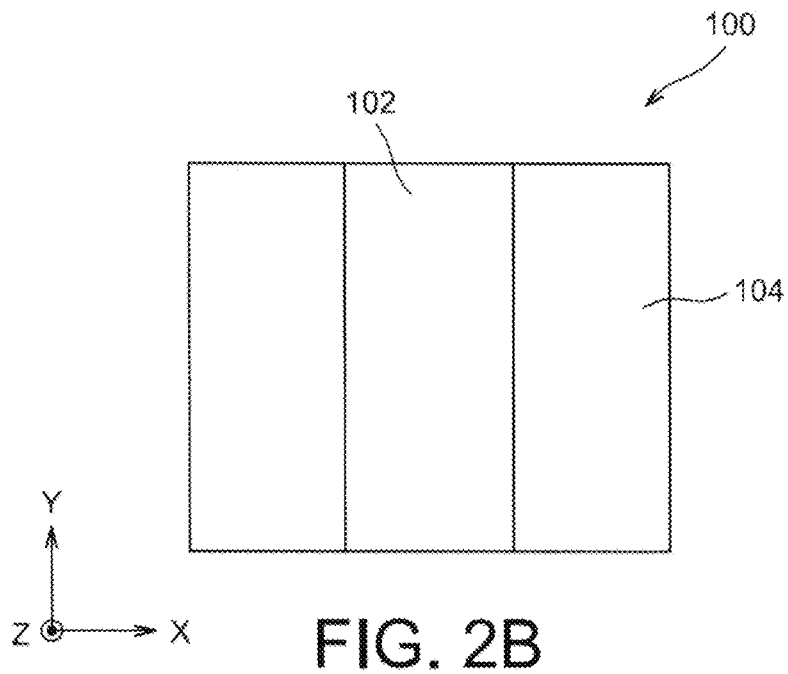
Figure 3A:
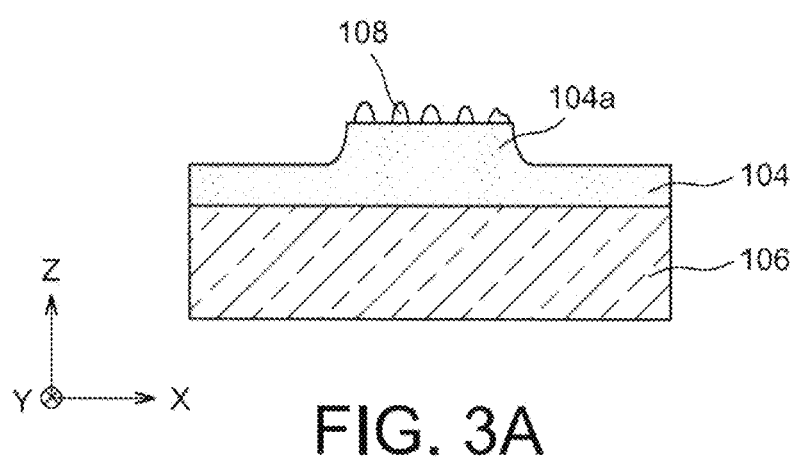
Figure 3B:
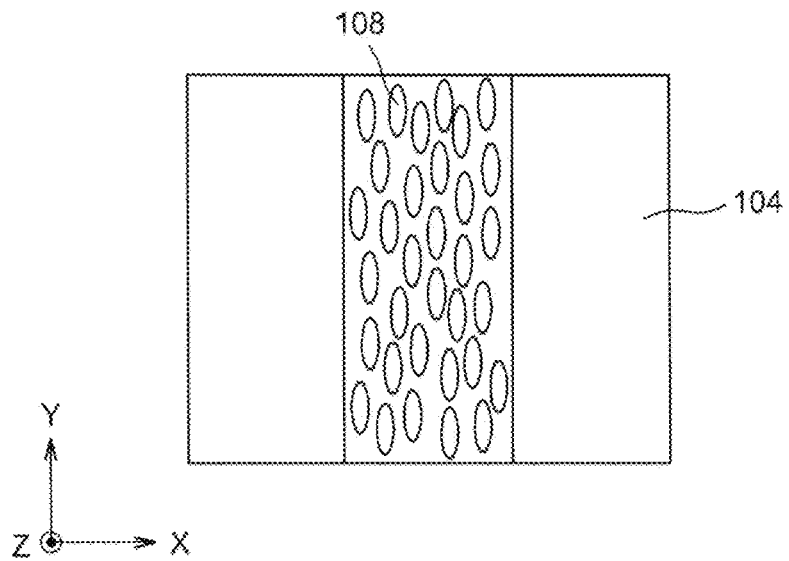

It is desired to uniaxially stress the semi-conductor of the thin layer 102, that is to subject the semi-conductor material to a force oriented along a single direction (herein parallel to the axis X), or to a force mainly oriented along this direction with an intensity at least twice, and preferably at least ten times, higher than the intensities of the possible other stresses exerted onto the semi-conductor along the other directions. To achieve this uniaxial stress, the dielectric layer 104 is etched throughout its thickness or, as in the example described herein, partially by forming, against the thin layer 102, a rectangular portion of material 104a such that one of its dimensions, in the plane (X,Y), that is a plane parallel to the main faces of the layers of the substrate 100, is higher than, for example at least ten times higher, than another of its dimensions in the plane (X,Y). In the example of FIGS. 2A and 2B which represent a profile cross-section view and a top view of the substrate 100, respectively, the layer 104 is etched by forming a portion 104a having a substantially rectangular cross-section (in the plane (X,Y)) whose dimension along the axis Y is higher than at least 10 times the dimension along the axis X. Thereby, the portion 104a forms a portion of dielectric material which is uniaxially stressed along the axis X.

Prior to etching the dielectric layer 104, the semi-conductor thin layer 102 is etched according to a similar pattern to that of the portion 104a of the dielectric layer 104 for the semi-conductor thin layer 102 to be uniaxially stressed (along the axis X in the example of FIGS. 2A and 2B). Upon etching the dielectric layer 104, the mask used for etching the semi-conductor thin layer 102 can be preserved, or removed depending on the etching selectivity of the dielectric material towards the semi-conductor material of the thin layer 102. If the mask is removed, the pattern formed by the etched thin layer 102 is used as a mask upon etching the dielectric layer 104.

The thin layer 102 thus becomes stressed due to the relaxation of the layer 104 perpendicular to the etching flanks. The thin layer 102 thereby is the place where a stress having an opposite sign to the sign of the stress initially present in the layer 102 prior to etching is exerted.

Further details and alternatives to make the uniaxially stressed semi-conductor thin layer are described in document US 2006/091105 A1.

The semi-conductor of the thin layer 102 can be a semi-conductor other than silicon, for example germanium or a silicon and germanium alloy, or a III-V material, i.e. GaN and/or AsGa and/or AlGaN and/or InGaN.

Then, a high temperature (for example equal to about 800° C., or more generally between about 600° C. and 800° C.) annealing is performed first resulting in the formation, at the thin layer 102, of aggregates of semi-conductor coming from the layer 102 (SiC aggregates, that is of silicon carbide, when the thin layer 102 is composed of silicon, or more generally aggregates composed of semi-conductor carbide). These aggregates are formed because of the carbon pollution present at the surface of the thin layer 102, the annealing decomposing the impurities forming this pollution. If the surface of the thin layer 102 is clean, without carbon pollution, it is possible to not perform this formation of aggregates.

The annealing proceeds at a temperature for example equal to 800° C. (similar to the temperature of the annealing forming the SiC aggregates) or for example between about 600° C. and 1250° C. or between 600° C. and 800° C., resulting in the dewetting of the semi-conductor of the thin layer 102, forming the semi-conductor nanocrystals 108, herein of silicon, onto the dielectric layer 104, and more accurately on the portion 104a of the dielectric layer 104. The majority of the silicon nanocrystals 108 have, in the plane (X,Y), an elongated shape cross-section, for example substantially rectangular, all of them being oriented parallel to the axis Y, that is perpendicular to the stress axis (see FIGS. 3A and 3B). The ratio of the greatest and the smallest dimension of one of the semi-conductor nanocrystals 108 is equal to about 0.7, and can be between about 0 and 1, and preferably between about 0.5 and 0.9.

Thus, at least 60% of the nanocrystals have an elongated shape and are oriented perpendicularly to the stress axis. Preferentially, compared to a non-stresses semi-conductor, around 90% of the nanocrytals have an elongated shape and are oriented perpendicularly to the stress axis in the case of a stress equal to around 1.6%, and around 60% of the nanocrytals have an elongated shape and are oriented perpendicularly to the stress axis in the case of a stress equal to around 0.8%.

The dewetting of the silicon of a non-stressed thin layer and having an initial thickness equal to about 7 nm forms silicon nanocrystals 108 the average height of which can be between about 70 nm and 140 nm and the area of which (in the plane (X,Y), measured at a distance about 20 nm from the dielectric layer 104) can be on average between about 14000 and 60000 $nm^2$.

The higher the stress on the semi-conductor of the thin layer 102, the lower the dimensions of the semi-conductor nanocrystals 108 obtained by dewetting and the greater the density of the nanocrystals 108.

For example, in the case of the non-stressed semi-conductor thin layer, the density of the silicon nanocrystals obtained is equal to about 2.6 nanocrystals/$\mu m^2$, the average height of these nanocrystals being equal to about 100 nm and their average area, measured at about 20 nm from the interface between the layers 102 and 104, is equal to about 39200 $nm^2$. By way of comparison, in the case of a biaxially stressed semi-conductor thin layer with an equivalent strain equal to about 0.76%, the obtained density of nanocrystals is equal to about 5.6 nanocrystals/$\mu m^2$, the average height of these nanocrystals being about 75 nm and their average area, measured at about 20 nm from the interface between the layers 102 and 104, is equal to about 28100 $nm^2$. In the case of a biaxially stressed semi-conductor thin layer and the equivalent strain of which is equal to about 1.15%, the obtained density of nanocrystals is equal to about 10.1 nanocrystals/$\mu m^2$, the average height of these nanocrystals being about 60 nm and their average area, measured at about 20 nm from the interface between the layers 102 and 104, is about 18500 $nm^2$. In the case of a biaxially stressed thin layer and the equivalent strain of which is equal to about 1.56%, the obtained density of nanocrystals is equal to about 17.2 nanocrystals/$\mu m^2$, the average height of these nanocrystals being about 45 nm and their average area, measured at about 20 nm from the interface between the layers 102 and 104, being about 13500 $nm^2$.

The high temperature annealing is implemented in a UHV ("Ultra High Vacuum") environment (pressure between about $10^{-7}$ mbar and $10^{-12}$ mbar), for example at a pressure equal to about $10^{-9}$ mbar. This annealing is for example implemented in an annealing frame under a controlled atmosphere or within a scanning electron microscope (SEM) or an atomic force microscope (AFM), such as a Veeco Dimension 3100 type microscope, or within a frame connected to the chamber of one of these equipment. The annealing is performed at a temperature between 700° C. and 1000° C., and for example at a temperature equal to about 800° C.+/−10° C., for a duration between a few minutes and a few tens of minutes (for example 10 minutes).

Since the dewetting kinetics is controlled by surface diffusion, the higher the annealing temperature, the shorter the annealing duration enabling the dewetting of the semi-conductor of the thin layer 102 to be made.

The semi-conductor nanocrystals 108 formed on the dielectric layer 104 can then be used to make nanoscale electronic devices, such as memory devices wherein the electric active areas correspond to the nanocrystals 108. The semi-conductor nanocrystals 108 can also be used as light emitting elements by taking advantage of their photoluminescence, for example for making LED (Light Emitting Diode) type devices.

Figure 4:
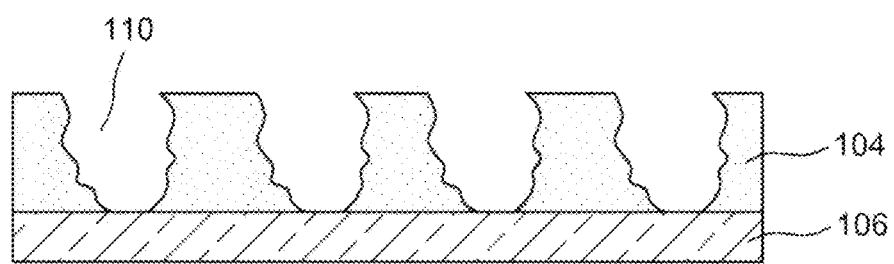
FIG. 4 represents a porous dielectric layer obtained by proceeding the annealing performed during the method for making semi-conductor nanocrystals.

The annealing can be performed until all the semi-conductor of the thin layer is dewetted and forms the nanocrystals 108. By prolonging the annealing (or by starting, after the dewetting, another annealing) after the dewetting of all the semi-conductor, and because of the high temperature, the silicon nanocrystals 108 react with the material of the dielectric layer 104. In the example described herein, there is the reaction: $SiO_2+Si \rightarrow 2SiO$. Because SiO evaporates, the silicon then forms holes 110 through the dielectric layers 104 such as represented in FIG. 4. The reaction occurring between the semi-conductor nanocrystals 108 and the dielectric material of the layer 104 wholly consumes the nanocrystals 108. The holes 110 have a particular shape due to the spiral movement of the nanocrystals 108 which "hollow out" the $SiO_2$ from the dielectric layer 104. When the nanocrystals 108 have an elongated shape with a shape factor lower than about 0.5, the capillary forces exerted onto the aggregate can restrict its freedom to move as a spiral movement. In this case, the holes 110 have a substantially conical shape, with, at the surface (upper surface of the dielectric layer 104), a shape close to the semi-conductor aggregate shape after dewetting. The flanks of the conical holes 110 form for example an angle, with respect to a direction perpendicular to the interface of the layers 104 and 106, between about 30° and 75°, and generally between about 40° and 65°.

In the example described herein, the holes 100 pass through the entire thickness of the dielectric layer 104 and open onto the silicon thick layer 106.

Because the described method enables the dimensions, density and orientation of the silicon nanocrystals 108 to be controlled, it is thereby possible to define and control dimensions, density and orientation of the holes 110. The dimension of these holes 110 at the upper face of the dielectric layer 104 (initially corresponding to the interface between the layers 102 and 104) is between about 1 and 5 times the diameter of the semi-conductor nanocrystals 108 initially formed before their reaction with the dielectric material of the layer 104.

The method for making semi-conductor nanocrystals described herein thus allows, by prolonging the annealing duration, to make, in the dielectric layer, a periodic pattern of holes the orientation, density and dimensions of which are controllable.

Figure 5:
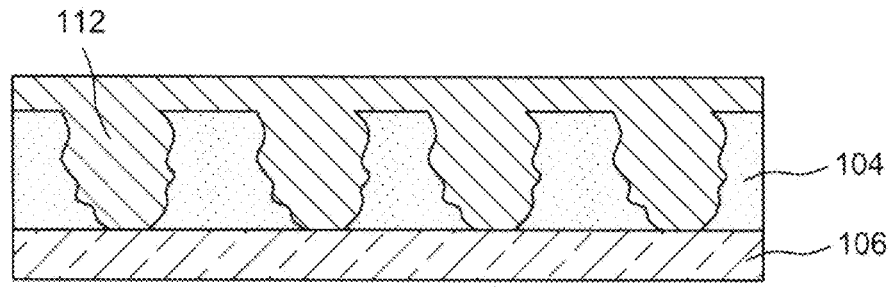
FIGS. 5 to 8 represent several possible uses of a porous dielectric layer obtained by proceeding the annealing performed during a method for making semi-conductor nanocrystals.
Figure 6:
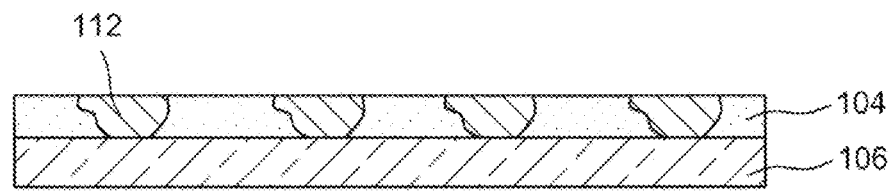

From the obtained porous dielectric layer, it is possible to make for example an array of conducting vias 112 between the front and back faces of the dielectric layer 104. To do this, a vacuum metal deposition (FIG. 5) can be made, filling the holes 110, and then a polishing in order to remove the metal lying on the upper face of the dielectric layer 104 and projecting from the holes 110. This polishing can also remove part of the thickness of the dielectric layer 104 in order to reduce the dimensions of the vias 112 (FIG. 6) in the plane (X,Y).

From the obtained porous dielectric layer, it is possible to make for example an array of dielectric capacitances. To do this, firstly a first metal electrode is deposited against a first face of the porous dielectric layer, and then a dielectric material is deposited into the pores of the porous dielectric layer, and finally a second metal electrode is deposited against a second face, opposite to the first face, of the porous dielectric layer. Thereby, an array of dielectric capacitances formed between both electrodes is obtained. For this kind of application, one or several masking/etching steps can be performed in order to ensure the electrical recontacting to the first electrode through the stack of layers made.

Figure 7:
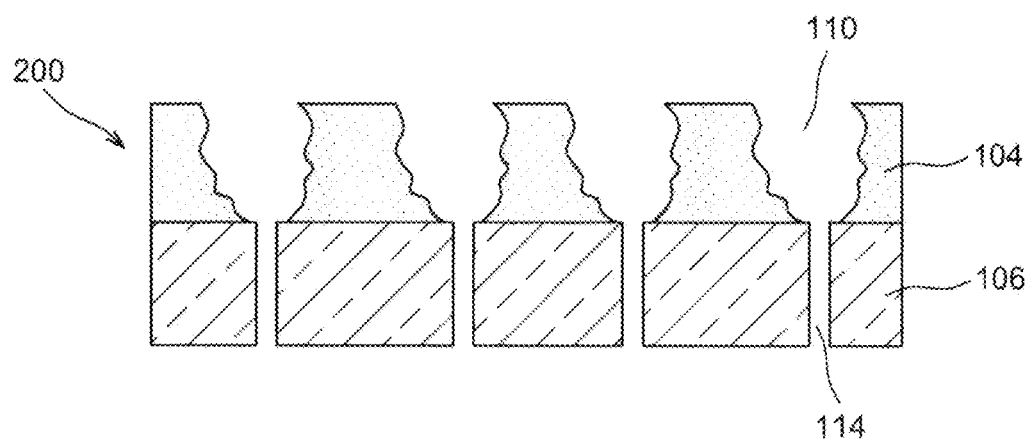
Figure 8:
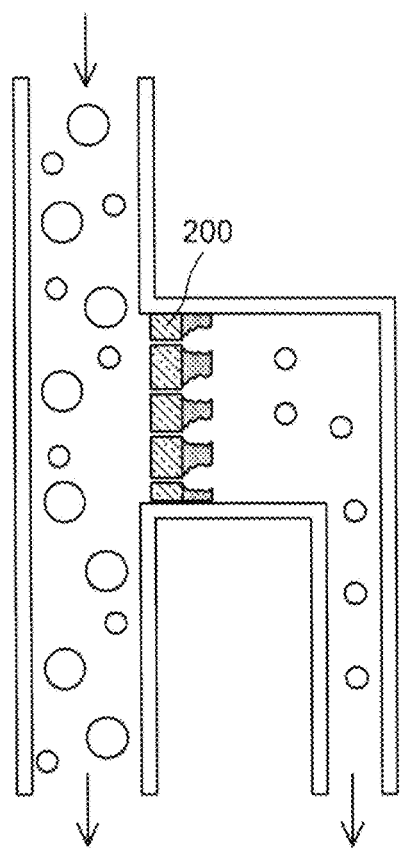

In another embodiment, the porous dielectric layer 104 obtained can be used as a microporous membrane. To do this, the silicon thick layer 106 can be etched such that holes 114, lying directly below the holes 110 passing through the dielectric layer 104, pass through the entire thickness of the silicon layer 106 (see FIG. 7). Thereby, a porous membrane 200 is obtained which can be used for example as a filter able to separate liquid or gas molecules, as represented in FIG. 8.

This porous membrane 200 can also be used in the field of diagnostics, of biological molecules that can be deposited into the holes, in which case the membrane is used as a detector.

It is possible to stop the annealing before the holes 110 open onto the interface between the layers 104 and 106. In this case, the semi-conductor nanocrystals are retrieved partly consumed at the bottom of the holes 110 (due to the reaction of the semi-conductor of nanocrystals with the dielectric of the layer 104). Because they are partly consumed, the dimensions of these nanocrystals are reduced as compared to the initial dimensions of the nanocrystals. These dimensions can range between 0 (case where the nanocrystals are totally consumed) and the quasi initial dimensions of the nanocrystals (in the case of holes having a very low depth). The holes 110 can then be plugged, for example by a deposition of silicon oxide. When the residual semi-conductor nanocrystals are present at the bottom of the holes, and after a step of depositing a dielectric material filling the previously formed holes, nanocrystals buried within a dielectric layer are obtained in this case.

Such a structure can also be obtained from a dielectric layer 104 comprising a stack of different dielectric materials, for example a $SiO_2/Si_3N_4$ or $SiO_2/Si_xO_yN_z$ bilayer, or any other stack comprising at least two dielectric materials whose kinetics of reaction with the semi-conductor of the nanocrystals are different (the kinetics of reaction of the material of the lower layer being selected much lower than that of the material of the upper layer for example composed of $SiO_2$). In this case, for a dielectric layer 104 corresponding for example of a $SiO_2/Si_3N_4$ bilayer, the holes 110 are formed in the $SiO_2$ and the interface between the $SiO_2$ and the underlying $Si_3N_4$ forms a natural stop place for the silicon nanocrystals. The final position of the residual semi-conductor nanocrystals within the dielectric layer 104 can thus be controlled through the thickness of the $SiO_2$ layer. As previously, the holes formed in $SiO_2$ can be filled by depositing a material, for example $SiO_2$.

It is also possible to provide the thickness of the dielectric layer 104 and the dimensions of the semi-conductor nanocrystals such that residual semi-conductor nanocrystals are present after passing through the entire thickness of the dielectric layer 104, these residual nanocrystals resting in this case on the thick layer 106.

The invention claimed is:

1. A method for making semiconductor nanocrystals, comprising:
    making a stack of at least one uniaxially stressed semiconductor thin layer and a dielectric layer, and
    annealing the semiconductor thin layer such that a dewetting of the semiconductor thin layer forms, on the dielectric layer, elongated shaped semiconductor nanocrystals oriented perpendicularly to the stress axis,
    wherein the dielectric layer is stressed and is provided between the semiconductor thin layer and a supporting layer, the stressing of the semiconductor thin layer being achieved by etching at least partially the dielectric layer according to a pattern such that the stress exerted on the etched dielectric layer is uniaxial.

2. The method according to claim 1, wherein the intensity value of the uniaxial stress is selected as a function of the desired dimensions and density of the semi-conductor nanocrystals.

3. The method according to claim 1, wherein the annealing of the semiconductor thin layer is performed at a temperature between about 700° C. and 1000° C. and under a ultra-high vacuum environment.

4. The method according to claim 1, wherein the annealing of the semiconductor thin layer is implemented in a scanning electron microscope or in a controlled environment annealing chamber.

5. A method for making a porous dielectric layer, including at least the implementation of a method for making semiconductor nanocrystals according to claim 1, wherein the annealing of the semiconductor thin layer is prolonged until the semiconductor nanocrystals chemically react with the dielectric layer forming a plurality of holes passing through the dielectric layer.

* * * * *